US012685080B2

(12) United States Patent
Lee

(10) Patent No.: US 12,685,080 B2
(45) Date of Patent: Jul. 14, 2026

(54) OHT MANAGEMENT SYSTEM AND CONTROL METHOD FOR OHT MANAGEMENT SYSTEM

(71) Applicant: Semes Co., Ltd, Cheonan-si (KR)

(72) Inventor: Man Gyu Lee, Cheonan-si (KR)

(73) Assignee: Semes Co., Ltd, Cheonan-si (KR)

( * ) Notice: Subject to any disclaimer, the term of this patent is extended or adjusted under 35 U.S.C. 154(b) by 520 days.

(21) Appl. No.: 18/323,109

(22) Filed: May 24, 2023

(65) Prior Publication Data

US 2024/0178029 A1     May 30, 2024

(30) Foreign Application Priority Data

Nov. 29, 2022     (KR) ........................ 10-2022-0163015

(51) Int. Cl.
 *H10P 72/30*      (2026.01)
 *H10P 72/00*      (2026.01)
(52) U.S. Cl.
 CPC ...... *H10P 72/3221* (2026.01); *H10P 72/0606* (2026.01)
(58) Field of Classification Search
 CPC .................... H01L 21/67733; H01L 21/67259
 See application file for complete search history.

(56) References Cited

U.S. PATENT DOCUMENTS 11,061,386 B2 * 7/2021 Shi .................... H01L 21/67727
11,183,409 B2 * 11/2021 Li ..................... H01L 21/67028

2019/0067508 A1 * 2/2019 Spotti ................... H10F 71/137
2019/0163170 A1 * 5/2019 Hsu ..................... H01L 21/6773
2022/0161833 A1 * 5/2022 Fujiwara ................ B61B 13/12
(Continued)

FOREIGN PATENT DOCUMENTS

JP       2007-001692 A      1/2007
KR       101812231 B1      12/2017
KR       101995204 B1       7/2019
(Continued)

OTHER PUBLICATIONS

Korean Office Action dated May 27, 2024 issued in corresponding Korean Appln. No. 10-2022-0163015.

*Primary Examiner* — Kyle O Logan
(74) *Attorney, Agent, or Firm* — Harness, Dickey & Pierce, P.L.C.

(57)          ABSTRACT

Embodiments of the inventive concept provide an OHT management system and a control method for the OHT management system for automatically setting an interlock in an operation section at which an operator is positioned, while the operator inspects an OHT or an article facility, even in a case in which the operator does not set an interlock information at the operation section. The OHT management system includes a rail; an OHT driving autonomously on the rail; a work terminal which generates a work progress information during a work procedure for proceeding with an inspection by closely approaching the rail within a predetermined distance; and an OCS for turning on an interlock information so the OHT does not drive at a section at which the work terminal is positioned, if the OCS communicates with the OHT to set the interlock information of the OHT and is input with the work progress information by communicating with the work terminal.

15 Claims, 5 Drawing Sheets

(56)                    References Cited

U.S. PATENT DOCUMENTS

2022/0348415 A1 * 11/2022 Li ........................ B65G 17/12

FOREIGN PATENT DOCUMENTS

KR        102096739 B1    4/2020
KR        102221115 B1    2/2021
KR        102324730 B1    11/2021
KR        102406591 B1    6/2022

* cited by examiner

OHT MANAGEMENT SYSTEM AND CONTROL METHOD FOR OHT MANAGEMENT SYSTEM

CROSS-REFERENCE TO RELATED APPLICATIONS

A claim for priority under 35 U.S.C. § 119 is made to Korean Patent Application No. 10-2022-0163015 filed on Nov. 29, 2022, in the Korean Intellectual Property Office, the entire contents of which are hereby incorporated by reference.

TECHNICAL FIELD

Embodiments of the inventive concept described herein relate to an OHT management system and a control method for the OHT management system, more specifically, an OHT management system and a control method for the OHT management system which manages a driving of an OHT.

BACKGROUND

Semiconductor manufacturing technology is responding to rapidly changing technology innovation speed and rapidly changing environment as technology-intensive future technologies are fused, especially as semiconductor devices are integrated and high-performance products are developed.

This semiconductor manufacturing article flow is managed according to the field situation through resolving bottlenecks, improving facility failures, and preventive maintenance (PM).

In accordance with this semiconductor manufacturing article flow, the semiconductor fab (FAB) performs various article returns using Overhead Hoist Transport (OHT).

These OHTs are operated in large quantities on the rail, and in order to control and manage them, there is an OCS (OHT Control System, hereinafter referred to as 'OCS') that controls and manages the entire OHTs.

In this case, when the OHT or article facilities are checked, the operator uses a ladder or a maintenance lift to perform the high place work, and at this time, the manager controls the OCS to set the Interlock to turn on to prevent OHT from entering the work area.

However, checking OHT or article facilities has a problem of increasing the risk of a safety accident if the interlock information of a operation section other than the operation section is turned on by the manager's mistake, or if the interlock information cannot be turned on by mistake.

SUMMARY

Embodiments of the inventive concept provide an OHT management system and a control method for the OHT management system for automatically setting an interlock in an operation section at which an operator is positioned, while the operator inspects an OHT or an article facility, even in a case in which the operator does not set an interlock information at the operation section.

The technical objectives of the inventive concept are not limited to the above-mentioned ones, and the other unmentioned technical objects will become apparent to those skilled in the art from the following description.

The inventive concept provides a OHT management system. The OHT management system includes a rail; an OHT driving autonomously on the rail; a work terminal which generates a work progress information during a work procedure for proceeding with an inspection by closely approaching the rail within a predetermined distance; and an OCS for turning on an interlock information so the OHT does not drive at a section at which the work terminal is positioned, if the OCS communicates with the OHT to set the interlock information of the OHT and is input with the work progress information by communicating with the work terminal.

In an embodiment, the rail is configured of a plurality which are connected to each other, and the OHT is configured in a plurality, and the OHT management system further includes a repeater configured in a plurality, which is positioned spaced apart from each other according to each region at which the plurality of rails are installed, and which transfers the work progress information from each of the plurality to the OCS, if the work progress information is generated at the work terminal.

In an embodiment, the OCS generates an interlock information according to each region at which the OHT drives autonomously, and changes an interlock information at which the work terminal is positioned among the interlock information, of the work progress information is generated In an embodiment, each of the plurality of repeaters further comprises repeater ID values which correspond to each of the interlock information, and the work terminal further comprises a work ID value and a signal strength value, and the work terminal transmits the work ID value and the signal strength value to each of the repeaters if the work progress information is transmitted, and the OCS communicates with each of the repeaters to be input with the repeater ID value, the work ID value, and the signal strength value, detects the repeater ID value of the repeater which transmits a largest signal strength value among the repeater ID value, the work ID value, and the signal strength value which is input, and transmits the interlock information corresponding to a repeater ID value which is detected to a turn-on state.

In an embodiment, the OHT management system further includes a maintenance lift at which the work terminal is positioned.

In an embodiment, the OHT management system further includes a fastening part which is provided attachable and detachable to the maintenance lift.

In an embodiment, the OHT management system further includes: a pressure sensor which is coupled to the fastening part, which generates a pressure signal if a pressure is put on a fastening area during a fastening of the fastening part to the maintenance lift, and which transmits the generated pressure signal to the work terminal, and wherein the work terminal generates the work progress information if input with the pressure signal.

In an embodiment, the OHT management system further includes: a detection sensor coupled to the fastening part, which generates a detection signal by detecting a state of which the maintenance lift is positioned at a fastening region of the fastening part, and which transmits the generated detection signal to the work terminal, and wherein the work terminal generates the work progress information if the detection signal is input.

In an embodiment, the maintenance lift further includes a lifting apparatus for adjusting a height of a work position.

In an embodiment, the maintenance lift further includes a driving apparatus for moving a work position.

In an embodiment, the OHT management system further includes: a height sensor electrically connected to the work terminal, which generates a height value by measuring a height of the work terminal, and which transmits the generated height value to the work terminal, and wherein the work terminal generates the work progress information if the height value is the same or above a predetermined value, if the height value is input.

In an embodiment, the OHT management system further includes: a weight sensor electrically connected to the work terminal, which generates a weight value by detecting a weight, and which transmits the generated weight value to the work terminal, and wherein the work terminal generates the work progress information is the weight value is the same or above a predetermined value, if the weight value is input.

The inventive concept provides an OHT management system control method. The OHT management system control method includes autonomously driving on a rail by on OHT; positioning a work terminal and a maintenance lift at a specific section on a rail; generating a work progress information by the work terminal if an operator proceeds with a work procedure for inspecting the OHT by going on the maintenance lift; transmitting the work progress information to an OCS through a repeater; and changing an interlock information by the OCS to a turn-on state so the OHT does not enter a section in which the work progress information is generated.

In an embodiment, the generating the work progress information further includes generating the work progress information if a fastening part for connecting an operator and the maintenance lift is fastened to the maintenance lift.

In an embodiment, the generating the work progress information further includes generating the work progress information if a pressure signal is generated, and the pressure signal is generated if a pressure is applied to a fastening area if the fastening part is fastened to the maintenance lift.

In an embodiment, the generating the work progress information further includes generating the work progress information if the detection signal is generated, and the detection signal is generated if a state of the maintenance lift being positioned is detected at a fastening region of the fastening part.

In an embodiment, the generating the work progress information further includes generating the work progress information if a height value is same or above a predetermined value.

In an embodiment, the generating the work progress information further includes generating the work progress information if a weight increases in the same or above a predetermined weight on the maintenance lift.

In an embodiment, the transmitting the work progress information further includes transmitting the work progress information and a signal strength value to the work terminal from a plurality of repeaters to the OCS, and the changing the interlock information further includes turning on the interlock information at a certain region at a section at which the repeater having a largest signal strength value among the signal strength values is positioned by the OCS so the OHT cannot enter.

The inventive concept provides an OHT management system. The OHT management system includes a rail configured in a plurality to be connected to each other; an OHT configured in a plurality and driving autonomously on the rail; a work terminal which generates a work progress information during a work procedure for proceeding with an inspection by closely approaching the rail within a predetermined distance and including a work ID value and a signal strength value; and an OCS which communicates with the OHT to set an interlock information of the OHT according to each region at which the OHT autonomously drives, which communicates with the work terminal to turn on an interlock information at which the work terminal is positioned among the interlock information so the OHT does not drive if the work state information is input; a repeater configured in a plurality, which each of the plurality are configured to further include repeater ID values which correspond to each interlock information, and which is input with the work ID value and the signal strength value, which is positioned spaced apart from each other according to each region at which the plurality of rails are installed, and which transfers the work progress information from each of the plurality to the OCS, if the work state information is generated at the work terminal; a maintenance lift at which the work terminal is positioned, and which includes a lifting apparatus for adjusting a height of a work position and a driving apparatus for moving the work position; a fastening part which is provided attachable and detachable to the maintenance lift, and which satisfied a generation condition of the work state information only if attached to the maintenance lift; a pressure sensor which is coupled to the fastening part, which generates a pressure signal if a pressure is put on a fastening area during a fastening of the fastening part to the maintenance lift, and of the work state information is generated at the work terminal if a generated pressure signal is transmitted to the work terminal; a detection sensor coupled to the fastening part, which generates a detection signal by detecting a state of which the maintenance lift is positioned at a fastening region of the fastening part, and of which the work state information is generated at the work terminal if a generated detection signal is transmitted to the work terminal; a height sensor electrically connected to the work terminal, which generates a height value by measuring a height of the work terminal, which transmits the generated height value to the work terminal, and of which the work state information is generated at the work terminal if the height value is input and the height value is the same or higher than a predetermined value; and a weight sensor electrically connected to the work terminal, which generates a weight value by detecting a weight, which transmits the generated weight value to the work terminal, and of which the work state information is generated at the work terminal if the weight value is input and the weight value is the same or higher than a predetermined value, and the OCS is input with the repeater ID value, the work ID value, and the signal strength value from the repeater, detects the repeater ID value of the repeater which transmits a largest signal strength value among the repeater ID value, the work ID value, and the signal strength value which is input, changes the interlock information to a turn-on state so the OHT does not enter within the interlock information which corresponds to the repeater ID value which is detected.

According to an embodiment of the inventive concept, a safety accident may be prevented as an interlock is automatically set at an operation section at which an operator is positioned, while the operator inspects an OHT or an article facility, even in a case in which the operator does not set an interlock information at the operation section.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
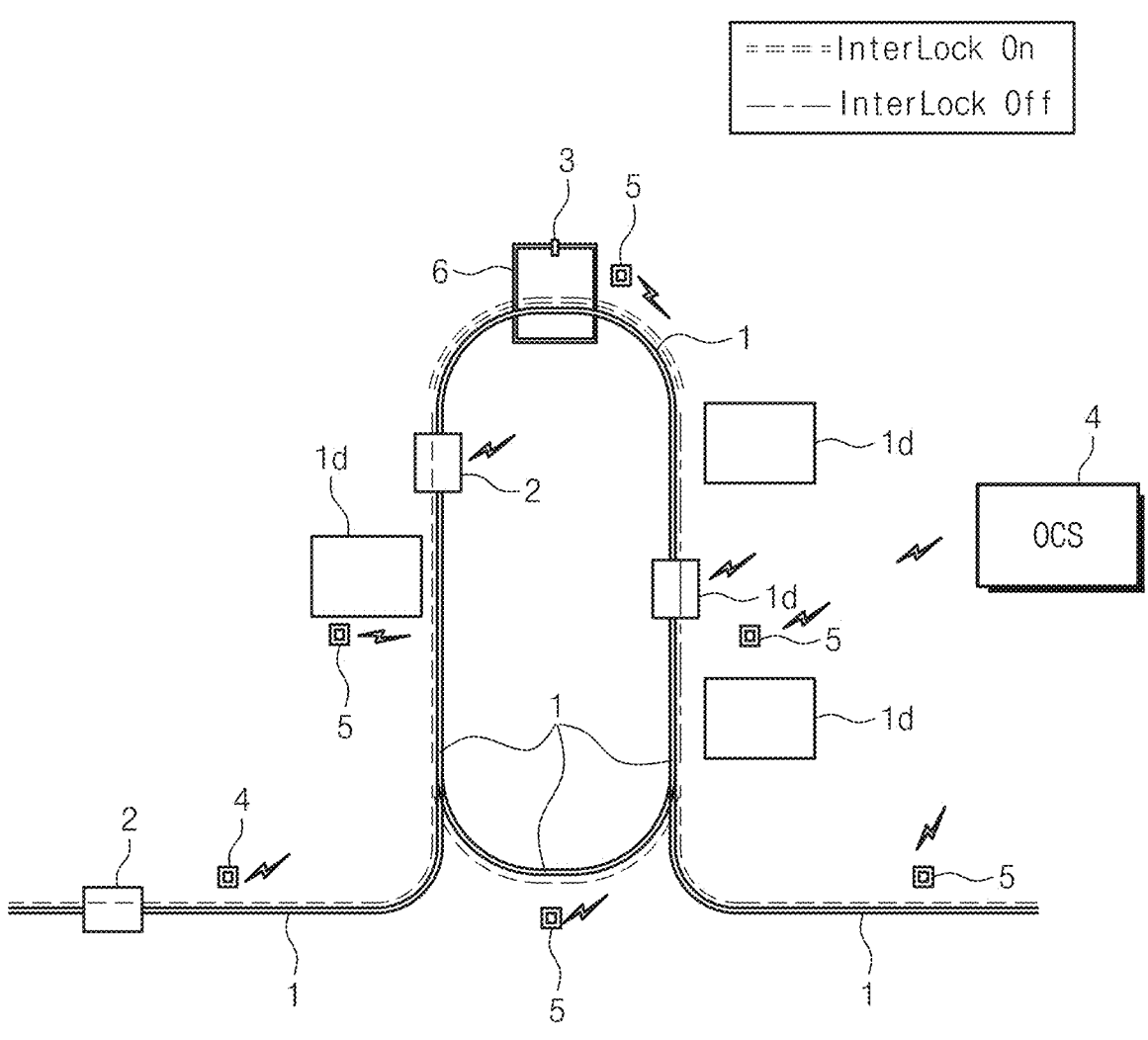
FIG. 1 is a plan view schematically illustrating an OHT management system according to an embodiment of the inventive concept.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
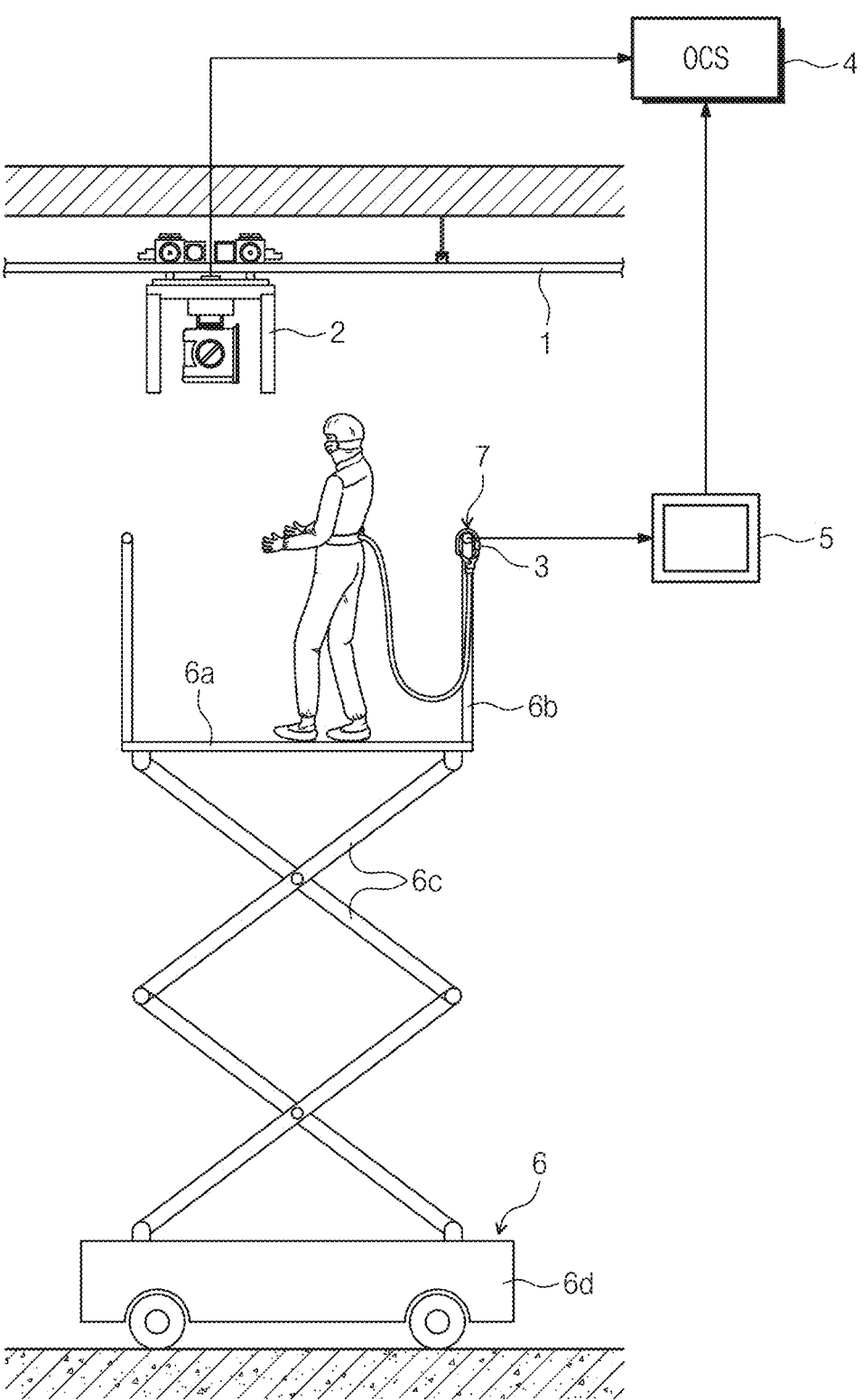
FIG. 2 is a partial front view of the OHT management system shown in FIG. 1 as an enlarged view of a state of installation on a maintenance lift.
Figure 3:
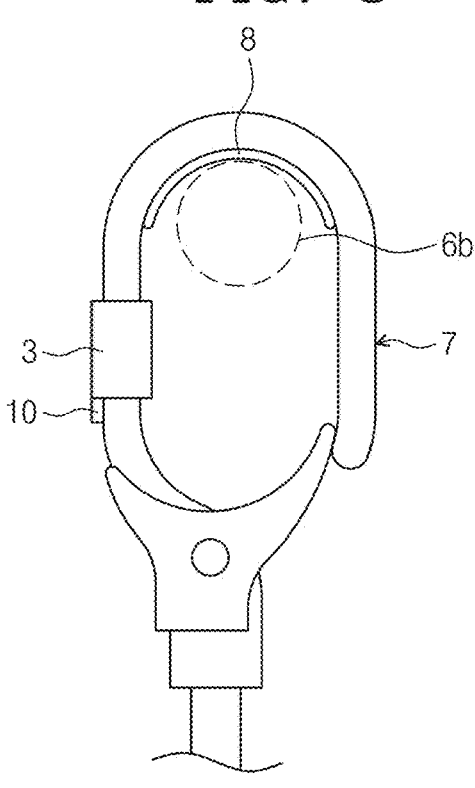
FIG. 3 is a partial front view of a fastening part shown in FIG. 2.
Figure 4:
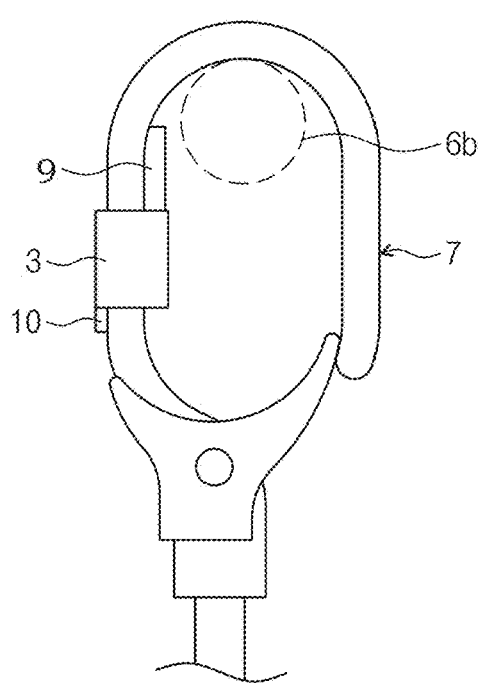
FIG. 4 is a partial front view of a modified example in which a proximity sensor is coupled to the fastening part of FIG. 3 instead of a pressure sensor.
Figure 5:
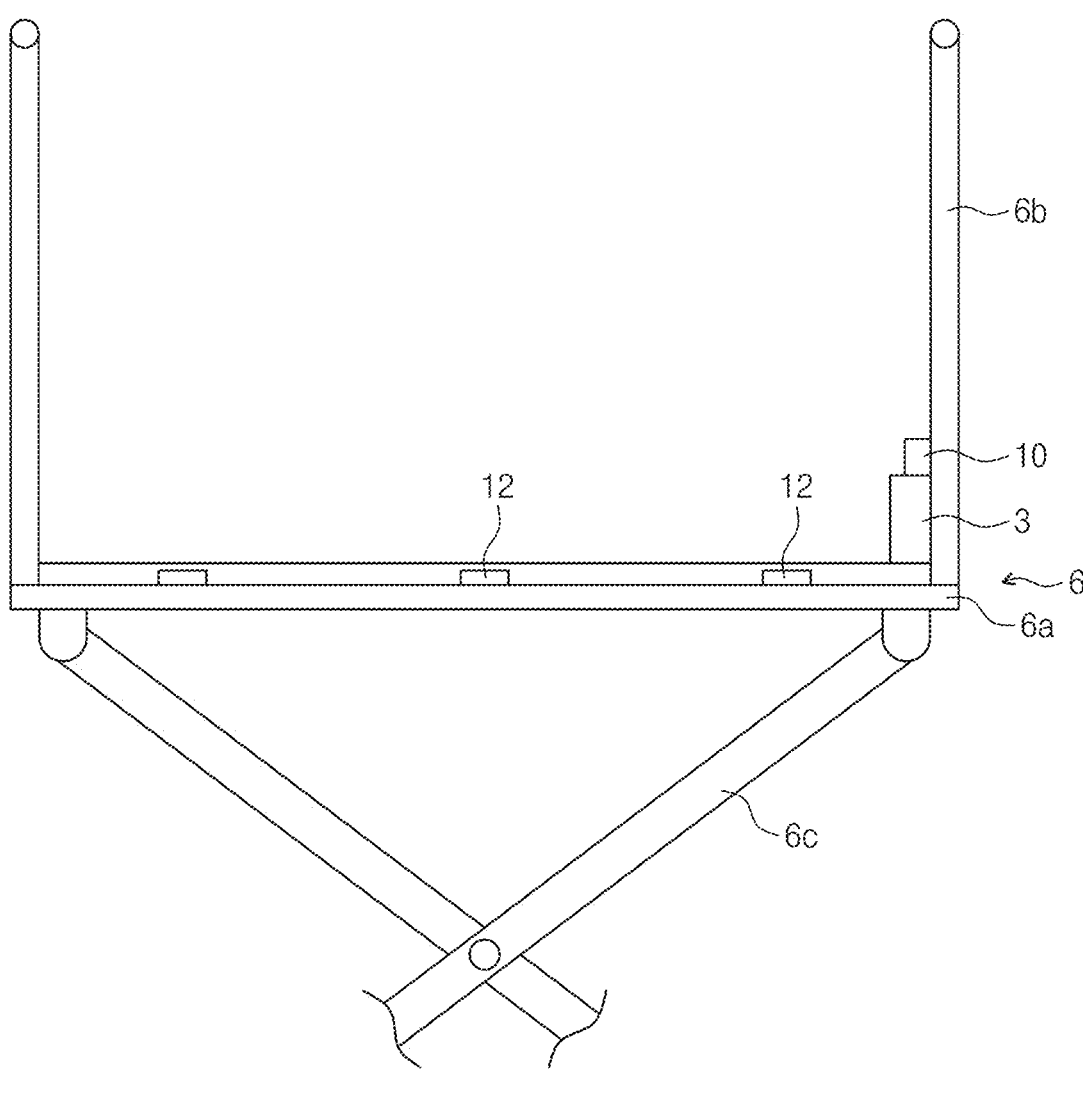
FIG. 5 is a partial front view of a modified example of the maintenance lift shown in FIG. 2.

FIG. 1 is a plan view schematically illustrating an OHT management system according to an embodiment of the inventive concept. FIG. 2 is a partial front view of the OHT management system shown in FIG. 1 as an enlarged view of a state of installation on a maintenance lift. FIG. 3 is a partial front view of a fastening part shown in FIG. 2. FIG. 4 is a partial front view of a modified example in which a detection sensor is coupled to the fastening part of FIG. 3 instead of a pressure sensor. FIG. 5 is a partial front view of a modified example of the maintenance lift shown in FIG. 2.

As shown in FIG. 1 and FIG. 2, the OHT management system according to an embodiment of the inventive concept includes a rail 1, an OHT 2, a work terminal 3, an OCS 4, and a repeater 5, and further includes a maintenance lift 6, a fastening part 7, a pressure sensor 8, a detection sensor 9, a height sensor 10, a magnetic sensor 11, and a weight sensor 12.

The rail 1 is installed in a top space of a semiconductor manufacturing factory at which semiconductor manufacturing facilities 1*d* are installed, and is coupled to a driving unit of the OHT 2 to guide a path of the OHT 2 to move along the rail 1. In addition, the rail 1 forms the path by combining multiple tracks with each other. In this case, a node information is set in the rail 1 for each predetermined section, and the OHT 2 acquires a position information on the rail 1 through the node information. Here, the path of the rail 1 is configured in a form in which a straight path and a curved path are selectively combined to pass through all the top spaces of the semiconductor manufacturing facilities 1*d* as shown in the view.

The OHT 2 is an autonomous driving apparatus which automatically transfers a FOUP (Front Open Unified Pod), which is a sealed wafer container for storing and transporting a wafer, while autonomously driving based on a previously input map for the OHT (not shown) on the rail 1. The OHT 2 is configured of a plurality, and each of the plurality of OHTs 2 is organically driven to transfer an article according to each of the semiconductor manufacturing facilities 1*d* according to a preset article transfer program. In this case, OHT 2 receives an article scheduling information regarding a departure point information, a destination information, and a cargo information to be loaded in communication with the OCS 4, and automatically transfers the article to each semiconductor manufacturing facility 1*d* according to the article scheduling information. In this case, the OHT 2 is equipped with a lidar sensor (not shown) to detect an obstacle and to avoid a collision with the obstacle when detecting the obstacle.

The work terminal 3 is a communication terminal device with a short-range wireless communication function such as a Bluetooth or a Wi-Fi, which is carried by an operator or positioned in combination with the maintenance lift, a seat belt, or a safety hook. The work terminal 3 generates a work progress information during a work procedure to proceed with an inspection within a certain distance from the rail 1, and transmits the generated work progress information to the repeaters 5. In addition, the work terminal 3 is carried by an operator for inspecting and installing the OHT 2, or is positioned around the maintenance lift 6. Here, the work progress information may be an information including a specific signal form or a digitized information value, or may be used as a form of transmitting a work ID value or a signal strength value to be described later. This work progress information is automatically generated without manually generating it by manipulating the work terminal 3, and here, a generation condition of the work progress information is, if a detection value of sensors connected to the work terminal 3 is the same or above a certain value. For example, the generation condition of the work progress information may be, if a distance between the work terminal 3 and the rail 1 is within a certain distance, if a pressure of the pressure sensor 8 connected to the work terminal 3 is the same or above a certain value, or if an object is detected within a certain distance 9 by the detection sensor 9 connected to the work terminal 3, or if a height value of the height sensor 10 connected to the work terminal 3 is the same or above a certain value, or if a weight value of the weight sensor 12 connected to the work terminal 3 is the same or above a certain value. In this case, the generated work progress information may be generated if only one of the above-described generation conditions is satisfied, or may be generated also if at least two or more conditions are satisfied. The generation conditions of such the work progress information will be described in more detail in the following description.

In addition, the work terminal 3 further includes a work ID value and a signal strength value. Here, the work ID value is an information for identifying operators or work contents, and is transmitted to the OCS 4 through the repeater 5 so that the OCS 4 and a manager can check it. The signal strength value is a value of a signal strength if a wireless communication is performed in the work terminal 3 and is transmitted to the OCS 4 through the repeater 5. In this case, since the signal strength value is determined if the repeater 5 receives a signal from the work terminal 3, a size value is increased in proportion to a distance between the work terminal 3 and the repeater 5.

The OCS 4 is a device for monitoring a driving state of the OHT 2 and a state and an article information state of the OHT 2, and for controlling and managing the driving state of the OHT 2 and the state and the article information state of the OHT 2. More specifically, the OCS 4 wirelessly communicates with OHTs 2 operating within a semiconductor manufacturing facility 1*d* to set or monitor the departure information, the destination information, and the position information of the OHTs. In addition, if the OHTs 2 transports the article within the semiconductor manufacturing facility 1*d*, the OCS 4 receives the article contents and an article loading/unloading information, and monitors the article contents and an article movement details. In addition, the OCS 4 monitors all driving conditions of OHTs 2 in communication with the OHTs 2 and receives and monitors a state information on a battery condition, a power condition, an overload conditions, and the like of OHT 2.

In addition, the OCS 4 sets an interlock information of the OHT 2 in communication with the OHT 2. Here, the interlock information is divided into groups of a node information corresponding to a specific region of the path based on a node information set for each section of the rail 1, and is an information of whether the OHT 2 is an interlock information or a non-driving route which is turned on and turned off. In this case, the OCS 4 prevents the OHT 2 from entering the rails 1 if the interlock information within the specific region of the rail 1 is turned on, and OHT 2 is set to enter if the interlock is turned off. A switching setting of the interlock information can be manually set by the manager who manages the OCS 4 to directly control an entry state of the OHT 2 in an unexpected situation.

In addition, the switching setting of the interlock information can be set automatically, in addition to a manual setting by the manager who manages the OCS 4, as mentioned above. In this case, the interlock information is automatically set to turn on the interlock information so that the OHT 2 does not travel on rails 1 at which the work terminal 3 is positioned if the OCS 4 receives the work progress information generated by the work terminal 3 from the repeater 5.

In addition, the OCS 4 stores a repeater ID value for each of the repeaters 5 and a position information value for each of the repeaters 5. In this case, the position information value for each of the repeaters 5 are graphically displayed and output to a display apparatus interlocking with the OCS 4. At this time, not only the position information of each of the repeaters 5 is graphically output to the display apparatus linked to OCS 4, but also a shape of the rail 1 and interlock information of each region of the rail 1 are graphically output. In addition, the OCS 4 may be configured such that each of the repeaters 5 corresponds to each of a plurality of interlock information. For example, if the interlock information is generated to set an interlock for a section of rail 1, one repeater 5 is set to match the section, and the interlock information and the repeater 5 can be set to correspond to the repeater ID value.

A plurality of relays 5 are configured, and are disposed to be spaced apart from each other for each region in which a plurality of rails 1 are installed. This repeater 5 works with the work terminal 3, and if the work progress information occurs in the work terminal 3, multiple repeaters 5 transmit the work progress information to the OCS 4. In this case, the OCS 4 generates the interlock information for each autonomous driving region of the OHT 2, and if the work progress information occurs, the interlock is turned on so that the OHT 2 does not enter the interlock information at which the work terminal 3 is positioned among the interlock information.

In this case, each of the plurality of repeaters 5 incorporates repeater ID values corresponding to each interlock information to determine a section in which the work terminal 3 is positioned. These repeater ID values are transmitted to OCS 4 together with the work ID value and signal strength value of the work terminal 3 if the work progress information is generated by the work terminal 3. The OCS 4 receives the repeater ID value, the work ID value and the signal strength value of the work terminal 3 from each of the relays 5 and detects the repeater ID value which transmits a largest signal strength value among a received repeater ID value, work ID value, and signal strength value. At this time, the OCS 4 switches the interlock information corresponding to the detected repeater ID value to the turn-on state to prevent the OHT 2 from entering the section. Here, since the signal strength values transmitted from the repeater 5 form a larger value as a distance between the repeater 5 and the work terminal 3 becomes closer, the OCS 4 detects the repeater 5 with a closest distance between the repeater 5 and the work terminal 3. Therefore, the OCS 4 can prevent safety accidents by preventing the OHT 2 from entering only a section at which the work terminal 3 is positioned, and allow the OHT 2 to autonomously drive in a section outside a certain distance of the work terminal 3.

The maintenance lift 6 is an apparatus which allows an operator to remotely adjust a height and position when inspecting the OHT 2 or the rail 1. In an embodiment, the maintenance lift 6 may include a scaffold 6a for the operator to work on, a handrail 6b surrounding the scaffold 6a to prevent the operator from falling, a lifting apparatus 6c for adjusting a height of a work position, and a driving apparatus 6d for moving the work position. Here, as shown in the view, the lifting apparatus 6c may be implemented in the form of the operator remotely adjusting a height of the lift while the operator is positioned on the scaffold 6a, and the driving apparatus 6d may be implemented in the form of the operator remotely adjusting a wheel linked to the motor while the operator is positioned on the scaffold 6a. The maintenance lift can remotely adjust a height to match a height of rails 1, the OHT 2, and other facilities with different heights, and increase a work efficiency by remotely moving a work position without the operator getting off. In addition, the maintenance lift 6 provides a region at which the fastening part 7, the work terminal 3, and the detection sensors can be attached to a specific position by the scaffold 6a and the handrail 6b.

The fastening part 7 is detachably fastened to the maintenance lift 6, and the work progress information can be generated from the work terminal 3 only if fastened with the maintenance lift 6. Here, a region at which the fastening part

7 is coupled to the maintenance lift 6 may be coupled to a rod for preventing the operator from falling, such as the handrail 6b formed on the maintenance lift 6. As an embodiment of such a fastening part 7, as shown in the drawing, the fastening part 7 may be configured in a form of a safety ring of a seat belt fastened to the maintenance lift 6 to prevent a falling accident if the operator works on the maintenance lift 6. In this case, the safety ring may be formed in a ring shape, and a rotating pin pressurized to a specific position by a plate spring may be formed in a partial region so as to be inserted into a rod or the like and fastened. However, in the inventive concept, the configuration of the fastening part 7 is not limited to the above-described example, and it goes without saying that the fastening part 7 may be modified in various forms.

The pressure sensor 8 is coupled to the fastening part 7 and generates a pressure signal if the fastening part 7 is pressurized if the fastening part 7 is fastened to the maintenance lift, and the generated pressure signal is transmitted to the work terminal 3. The pressure sensor 8 may be composed of a strain gauge, a piezoelectric sensor, and a sensor which senses a pressure such as a load cell. In this case, a position at which the pressure sensor 8 and the fastening part 7 are coupled is a part at which an inner region of the fastening part 7 contacts the maintenance lift 6. The pressure sensor 8 generates a pressure signal to the work terminal 3 if the operator engages the fastening part 7 with the maintenance lift 6 to check the OHT 2. In this case, the work terminal 3 generates the work progress information, and the work progress information is transmitted to the OCS 4 through the repeater 5. After receiving the work progress information, the OCS 4 automatically sets the OHT 2 not to enter the operation section by turning on the interlock information of a section at which the repeater 5 is positioned.

Meanwhile, as shown in FIG. 4, the fastening part 7 may generate the work progress information using the detection sensor 9 in addition to a method of using the pressure sensor 8. In this case, the detection sensor 9 is coupled to the fastening part 7, and a detection signal is generated by detecting a state in which the maintenance lift 6 is positioned at a fastening region of the fastening part 7. In this case, the detection sensor 9 is a sensor for determining whether an object is within a certain distance, and may consist of a proximity sensor such as an ultrasonic sensor, a laser displacement sensor, an infrared sensor, an eddy current sensor, a magnetic sensor, and a limit switch. If the handrail 6b of the maintenance lift 6 is inserted into the fastening region of the fastening part 7, the detection sensor 9 may detect a shape of the rod, a metal material, or whether there has been a contact, and may generate the detection signal. Here, the work terminal 3 which receives the detection signal generates the work progress information and transmits the work progress information to the OCS 4 through the repeater 5, and the OCS 4 which receives the work progress information turns on the interlock information at a section at which the repeater 5 is positioned, to automatically set the OHT 2 from entering the operation section.

The height sensor 10 may be configured to be coupled to the fastening part 7 or may be configured to be coupled to the maintenance lift 6. The height sensor 10 is electrically connected to the work terminal 3, and a height value is generated by measuring a height of the work terminal 3, and the generated height value is transmitted to the work terminal 3. In this case, if the height value is input, the work terminal 3 generates the work progress information of the height value is equal to or greater than a preset value. For example, if the height of the height sensor 10 is within a certain distance from the OHT 2 by lifting the lifting apparatus 6c while the operator is on the maintenance lift 6, the work terminal 3 generates the work progress information and transmits it to OCS 4. At this time, the OCS 4 which has received the work progress information automatically sets the OHT 2 not to enter the operation section by turning on the interlock information of the section where the repeater 5 is positioned. In this way, if the position of the operator is changed to be adjacent to the OHT 2 using the maintenance lift 6, the height sensor 10 prevents the OHT 2 from entering the operation section at a corresponding position to prevent an accident.

The weight sensor 12 is coupled to the maintenance lift 6 and detects the weight of the operator. In this case, the weight sensor 12 may be configured as a sensor which measures a weight such as a load cell. The weight sensor 12 is electrically connected to the work terminal 3, and if it detects the weight of the operator on the maintenance lift 6, it generates a weight value and transmits the generated weight value to the work terminal 3. At this time, if the generated weight value is above or the same as a predetermined value, the work progress information is transmitted. For example, if the weight value detected by the weight sensor 12 increases by 40 Kg or more, the work terminal 3 generates the work progress information. The generated work progress information is transmitted to the OCS 4. At this time, the OCS 4 receiving the work progress information automatically sets the OHT 2 not to enter the operation section by turning on the interlock information of a section at which the repeater 5 is positioned. In this way, the weight sensor 12 prevents the OHT 2 from entering the operation section at a corresponding position if the operator is on the maintenance lift 6, thereby preventing an accident from occurring.

Hereinafter, a control method of the OHT management system using the OHT management system as described above will be described.

Figure 6:
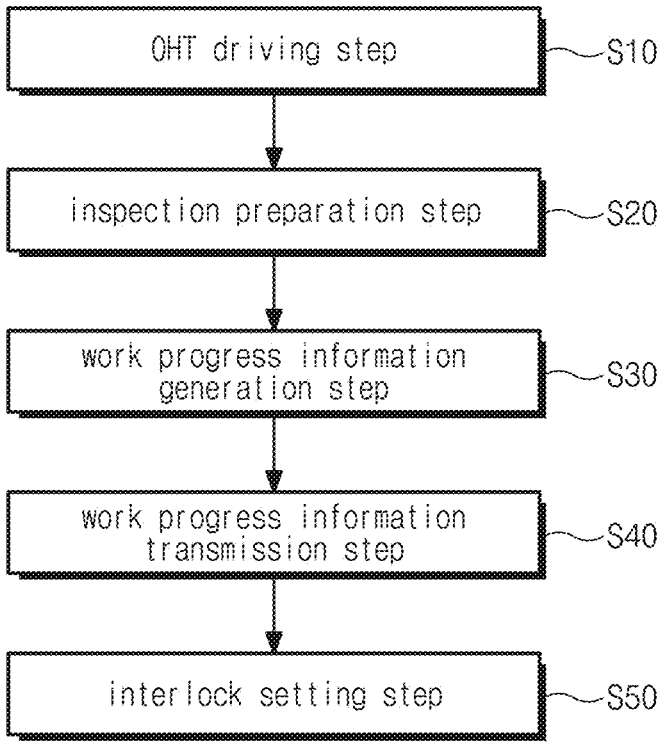
FIG. 6 is a flowchart of a control method the OHT management system according to an embodiment of the inventive concept.

FIG. 6 is a flowchart of the control method of the OHT management system according to an embodiment of the inventive concept.

As shown in FIG. 6, an OHT management system control method according to an embodiment of the inventive concept includes an OHT driving step S10, an inspection preparation step S20, a work progress information generation step S30, a work progress information transmission step S40, and an interlock setting step S50.

Referring further to FIG. 6, first, in the OHT driving step S10, the OHT 2 autonomously travels on the rail 1.

Next, in the inspection preparation step S20, the inspector arranges the work terminal 3 and the maintenance lift 6 in a specific section on the rail 1.

Next, in the work progress information generation step S30, the operator gets on the maintenance lift 6 and the work terminal 3 generates the work progress information during a work procedure for checking the OHT 2. In this case, the generated work progress information is generated of the fastening part 7 connecting the operator and the maintenance lift 6 is fastened to the maintenance lift 6, as described above. At this time, as described above, the work progress information is generated based on a pressure signal generated by the pressure sensor 8 if a pressure is applied to the fastening part 7 if fastening with the maintenance lift 6. In addition, the work progress information may be generated if the detection sensor 9 generates a detection signal by detecting the position of the maintenance lift 6 in the fastening region of the fastening part 7, as described above.

In addition, as described above, the work progress information may be generated if the magnetic sensor generates a magnetic signal by detecting the position of the maintenance lift 6 in a fastening region of the fastening part 7. In addition, as described above, the work progress information may be generated if the height value is equal to or greater than a predetermined value using the height sensor 10. In addition, the work progress information can be generated if the operator climbs on the maintenance lift 6 and a weight of the maintenance lift 6 increases by a certain value or more. In this case, the work progress information may be generated using at least one of a pressure detection, a detecting detection, a height detection, and weight detection methods, or a combination thereof.

Next, in the work progress information transmission step S40, the work progress information is transmitted to the OCS 4 through the repeater 5. In this case, as described above, the repeater 5 may transmit the repeater ID value to OCS 4 to match a position of the repeater 5 through a repeater ID value previously stored in the OCS 4. In this case, the repeater 5 transmits the work ID value and the signal strength value to the OCS 4 along with the repeater ID value and the work progress information of the work terminal 3.

Next, in the interlock setting step S50, the interlock information is switched to a turned-on state so that the OHT 2 does not enter a section in which the work progress information is generated. In this case, the OCS 4 can detect the repeater ID value of the repeater 5 which transmits a largest signal strength value among the repeater ID value, the work ID value, and the signal strength value of the work terminal 3 which is input from the repeaters 5 and may switch the interlock information to the turn-on state.

Next, the operator performs work on checking and repairing the OHT 2 or surrounding facilities. At this time, while working, the operator remotely adjusts the lifting apparatus 6c of the maintenance lift 6 to adjust the work position, and remotely moves the driving apparatus 6d to adjust the work position. At this time, the OCS 4 receives continuous input of the work progress information generated in the work terminal 3 from the repeaters 5 and prevents the OHT 2 from entering the operation section.

On the other hand, as described above, if the operator who checks the OHT 2 remotely moves the maintenance lift 6 to change the work position, the operation section can be changed to a section with an interlock information different from an initial interlock information, at which time a distance between the work terminal 3 and the repeaters 5 is changed. Then, the OCS 4 switches the interlock information of a section at which the repeater 5 that generates a largest signal strength value again to the turn-on state. Therefore, if the operator performs the work while moving a high-speed workstation, the interlock information is automatically switched to the turn-on state in a corresponding section, thereby preventing a safety accident from occurring.

After the inspection, the operator remotely operates the lifting apparatus 6c of the maintenance lift 6 so that the lift faces the ground, and if the fastening part 7 and the maintenance lift 6 are released, the work terminal 3 stops generating the work progress information. Then, the interlock information of the corresponding section is turned off by the OCS 4, and the OHT is set to enter a section in which a work is completed.

In this way, the OHT management system and OHT management system control method according to an embodiment of the inventive concept prevents safety accidents by automatically setting interlocks in the operation section at which the operator is positioned even if the manager does not set the interlock information in the operation section, while the operator checks the OHT 2 or article facilities.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. An overhead hoist transport (OHT) management system comprising:
  a rail;
  an OHT configured to drive autonomously on the rail;
  a work terminal configured to generate work progress information during a work procedure based on an input of one or more sensors during an inspection of the rail within a set distance; and
  an OHT control system (OCS) configured to communicate with the OHT and the work terminal, and the OCS is configured to generate interlock information based on the work progress information of the work terminal,
  wherein the OCS is further configured to prevent the OHT from driving in a section at which the work terminal is positioned based on the interlock information, and
  wherein the interlock information includes
    node information corresponding to each region of the rail, and
    an interlock setting indicating a driving state or a non-driving state for each region of the rail.

2. The OHT management system of claim 1, wherein
  the rail is included in a plurality of rails which are connected to each other,
  the OHT is included in a plurality of OHT, and
  the OHT management system further includes a plurality of repeaters, the plurality of repeaters being spaced apart from each other and each of the plurality of repeaters corresponding to a region of each of the plurality of rails, and the plurality of repeaters configured to transfer the work progress information to the OCS based on the work progress information being generated by the work terminal.

3. The OHT management system of claim 2, wherein the OCS is configured to generate the interlock information based on a region at which the OHT drives autonomously, and update the interlock information based on a position of the work terminal.

4. The OHT management system of claim 2, wherein
  each of the plurality of repeaters further comprises a repeater ID value,
  the work terminal further comprises a work ID value and a signal strength value,
  the work terminal is configured to transmit the work ID value and the signal strength value to each of the plurality of repeaters based on the work progress information being transmitted, and
  the OCS is configured to communicate with each of the plurality of repeaters to receive the repeater ID value, the work ID value, and the signal strength value,
  detect a largest signal strength value among each signal strength value of the plurality of repeaters and transmit the repeater ID value, the work ID value, and the signal strength value from one of the plurality of repeaters corresponding to the largest signal strength value, and
  transmit the interlock information corresponding to the detected largest signal strength value among the plurality of repeaters.

5. The OHT management system of claim 1, further comprising:
  a maintenance lift configured to be coupled with the work terminal.

6. The OHT management system of claim 5, further comprising:
  a fastening part configured to be attachable and detachable to the maintenance lift.

7. The OHT management system of claim 6, further comprising:
  a pressure sensor of the one or more sensors coupled to the fastening part and configured to generate a pressure signal based on a pressure being applied to the pressure sensor during a fastening of the fastening part to the maintenance lift, and the pressure sensor configured to transmit the pressure signal to the work terminal,
  wherein the work terminal is configured to generate the work progress information based on the pressure signal being transmitted to the work terminal.

8. The OHT management system of claim 6, further comprising:
  a detection sensor of the one or more sensors coupled to the fastening part, the detection sensor configured to generate a detection signal based on a portion of the maintenance lift being detected in a fastening region of the fastening part, and the detection sensor configured to transmit the detection signal to the work terminal,
  wherein the work terminal is configured to generate the work progress information based on the detection signal being received by the work terminal.

9. The OHT management system of claim 5, wherein the maintenance lift further includes a lifting apparatus configured to adjust a height of a work position.

10. The OHT management system of claim 5, wherein the maintenance lift further includes a driving apparatus configured to move a work position.

11. The OHT management system of claim 1, further comprising:
  a height sensor of the one or more sensors electrically connected to the work terminal, the height sensor configured to generate a height value by measuring a height of the work terminal and transmit the height value to the work terminal,
  wherein the work terminal is configured to generate the work progress information if the height value is a same height value or above a set height limit value.

12. The OHT management system of claim 1, further comprising:
  a weight sensor of the one or more sensors electrically connected to the work terminal, the weight sensor configured to generate a weight value by detecting a weight and transmitting the weight value to the work terminal, wherein the work terminal is configured to generate the work progress information based on the weight value being a same weight or above a set weight limit value.

13. An overhead hoist transport (OHT) management system comprising:

a plurality of rails configured to be connected to each other;

a plurality of OHT configured to drive autonomously on the plurality of rails;

a work terminal configured to generate work progress information during a work procedure based on an input of one or more sensors during an inspection of one or more of the plurality of rails within a set distance, and the work terminal including a work ID value and a signal strength value;

an OHT control system (OCS) configured to communicate with the plurality of OHT, and the OCS configured to generate interlock information to prevent each of the plurality of OHT from driving in a region at which the work terminal is positioned based on the work progress information;

a plurality of repeaters spaced apart from each other and corresponding to each region of the plurality of rails, each of the plurality of repeaters including a repeater ID value corresponding to the interlock information, the repeater ID value configured to be transmitted to the OCS with the work ID value and the signal strength value, and the plurality of repeaters configured to transfer the work progress information from each of the plurality of repeaters to the OCS based on the work progress information being generated at the work terminal;

a maintenance lift configured to be coupled with the work terminal, the maintenance lift including a lifting apparatus configured to adjust a height of a work position and a driving apparatus configured to move the work position;

a fastening part configured to be attachable and detachable to the maintenance lift;

a height sensor of the one or more sensors electrically connected to the work terminal, the height sensor configured to generate a height value by measuring a height of the work terminal and transmit the height value to the work terminal, the work terminal further configured to update the work progress information based on the height value and determine if the height value is a same height or higher than a set height limit value; and a weight sensor of the one or more sensors electrically connected to the work terminal, the weight sensor configured to generate a weight value by detecting a weight and transmitting the weight value to the work terminal, the work terminal further configured to update the work progress information based on the weight value and determine if the weight value is a same weight or higher than a set weight limit value, wherein the OCS is configured to receive the repeater ID value, the work ID value, and the signal strength value from each of the plurality of repeaters, detect a largest signal strength value among the plurality of repeaters and transmit the repeater ID value, the work ID value, and the signal strength value from one of the plurality of repeaters corresponding to the detected largest signal strength value, and update an interlock setting of the interlock information to a turn-on state so each of the plurality of OHT is prevented from entering a region corresponding with the one of the plurality of repeaters corresponding to the detected largest signal strength value, wherein the interlock information includes node information corresponding to each region of the plurality of rails, and wherein the interlock setting indicates a driving state or a non-driving state for each region of the plurality of rails.

14. The overhead hoist transport (OHT) management system of claim 13, further comprising:

a pressure sensor of the one or more sensors coupled to the fastening part and configured to generate a pressure signal based on a pressure being applied to the pressure sensor during a fastening of the fastening part to the maintenance lift, the pressure signal configured to satisfy a generation condition of the work progress information based on the fastening part being attached to the maintenance lift, and the work progress information is configured to be generated at the work terminal based on the pressure signal being transmitted to the work terminal.

15. The overhead hoist transport (OHT) management system of claim 13, further comprising:

a detection sensor of the one or more sensors coupled to the fastening part, the detection sensor configured to generate a detection signal based on a portion of the maintenance lift being detected in a fastening region of the fastening part, and the detection sensor configured to transmit the detection signal to the work terminal, wherein the work terminal is configured to generate the work progress information based on the detection signal being received by the work terminal.

* * * * *